United States Patent [19]

Stein

[11] 4,142,147

[45] Feb. 27, 1979

[54] METHOD AND SYSTEM FOR TESTING THE ACCURACY OF AN ELECTRONIC CLOCK

[75] Inventor: Manfred Stein, Eschborn, Fed. Rep. of Germany

[73] Assignee: Quarz-Zeit AG, Frankfurt am Main, Fed. Rep. of Germany

[21] Appl. No.: 837,281

[22] Filed: Sep. 27, 1977

[30] Foreign Application Priority Data

Oct. 15, 1976 [DE] Fed. Rep. of Germany ....... 2646511

[51] Int. Cl.[2] .............................................. G01R 23/14

[52] U.S. Cl. ................................ 324/79 R; 324/78 D

[58] Field of Search ........................ 58/23 AC, 23 TF; 324/181, 186, 187, 79 R, 79 D, 78 D; 328/134; 73/6

[56] References Cited

U.S. PATENT DOCUMENTS 3,013,208 12/1961 Voznak ............................... 324/186

3,777,547 12/1973 Izumi .................................. 324/186

*Primary Examiner*—M. Tokar

*Attorney, Agent, or Firm*—Otto John Munz

[57] ABSTRACT

A method and system for testing the accuracy of the oscillators of electronic clocks includes transforming a frequency signal corresponding to the output of a clock oscillator into a non-sinusoidal signal having the same frequency as the frequency signal and filtering the non-sinusoidal signal to pass a component of the non-sinusoidal signal having a frequency associated with a reference frequency to be compared with the signal passed by the filter such that clock oscillators operating at various frequencies of which the reference frequency is an integral multiple can be tested since the non-sinusoidal signal, which is preferably a sawtooth signal, contains harmonic components corresponding to the reference frequency.

11 Claims, 1 Drawing Figure

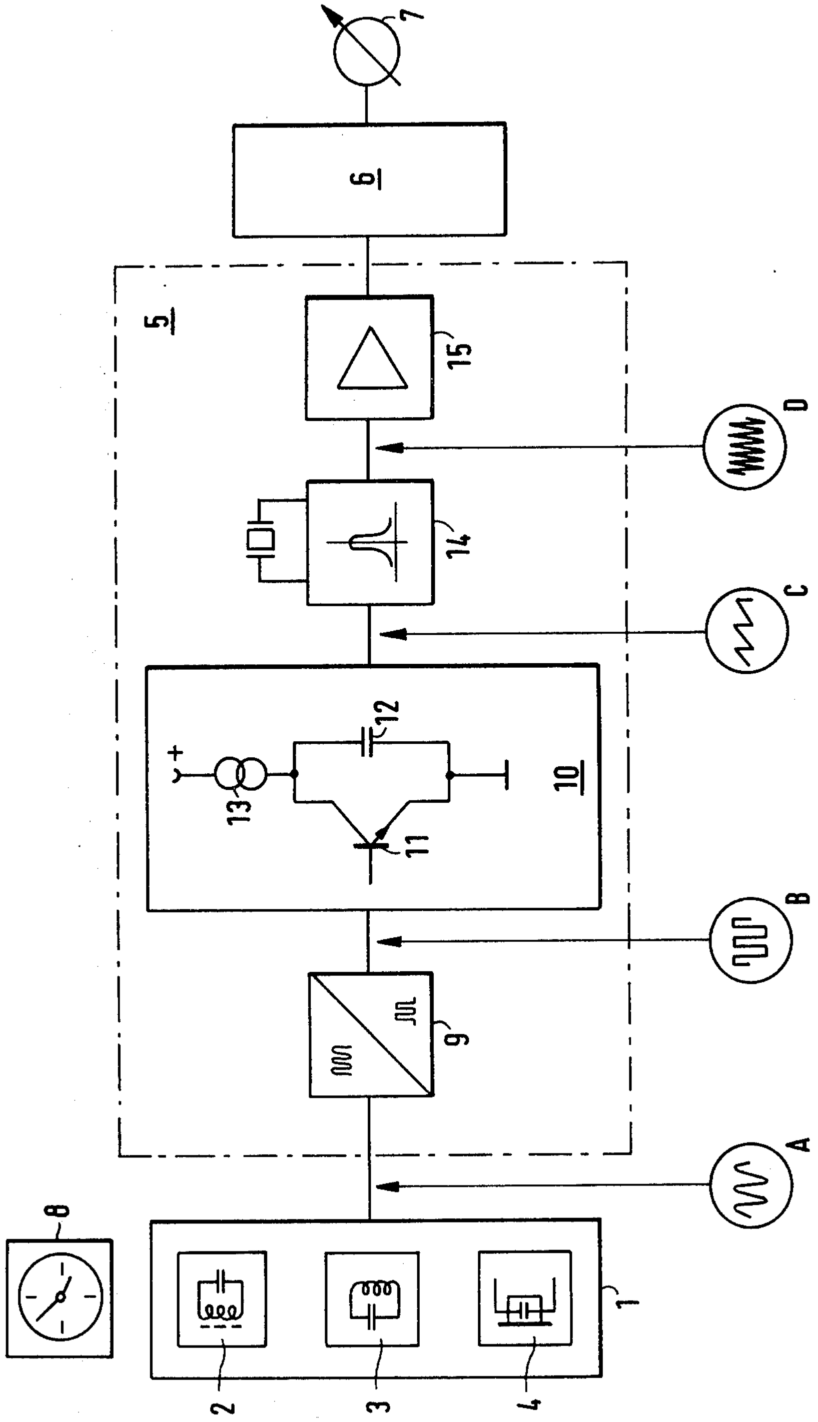
1
2
3
4
5
6
7
8
9
10
11
12
13
14
15
A
B
C
D

METHOD AND SYSTEM FOR TESTING THE ACCURACY OF AN ELECTRONIC CLOCK

BACKGROUND OF THE INVENTION

1. Field of the Invention

The present invention pertains to the testing of electronic clocks and, more particularly, to a method and system for testing the accuracy of oscillators of electronic clocks by transforming the outputs of the oscillators into non-sinusoidal signals. 2. Discussion of the Prior Art It is conventional in the testing of the accuracy of quartz crystal clocks to pick up or detect the output of the clock oscillators by means of an antenna and to compare the detected signal with a reference frequency signal. The deviation of the detected frequency signal from the reference frequency signal is then indicated in digital or analog form to permit adjustment, if desired, of the clock oscillator. The oscillators of quartz crystal clocks operate at various frequencies, for example, 16.384kHz, 32.768kHz, 262.175kHz and 4.194MHz; and normally, a separate apparatus is required for testing each oscillator frequency since a different reference frequency signal must be provided corresponding to the oscillator frequency of the clock being tested. Accordingly, it is quite expensive for a clockmaker to maintain sufficient equipment on hand to test existing types of electronic clocks and, additionally, the clockmaker is required to have a knowledge of the oscillator frequency of any clock being tested in order to select the appropriate apparatus necessary for testing that clock. If this knowledge is not available, the clockmaker must determine the frequency of the clock by trial and error which is, of course, quite time consuming.

SUMMARY OF THE INVENTION

Accordingly, it is an object of the present invention to overcome the above mentioned disadvantages of the prior art by providing a method and system for testing the accuracy of electronic clocks having various oscillator frequencies by use of a single apparatus.

Another object of the present invention is to transform the frequency signal detected by an antenna from a clock oscillator into a non-sinusoidal signal of the same frequency and to filter the non-sinusoidal signal to pass only a component thereof having a frequency associated with the reference frequency for ultimate comparison with the reference frequency for testing purposes.

A further object of the present invention is to transform the frequency signal detected from a clock oscillator into a sawtooth signal in order to provide the largest possible number of integral multiples of the frequency signal (fundamental frequency) such that a harmonic component associated with a reference signal to which the component is to be compared can be passed to comparing and indicating circuitry.

The present invention has an additional object in that circuitry for transforming a frequency signal corresponding to the output of a clock oscillator into a non-sinusoidal signal includes a rectangular pulse generator for transforming the frequency signal from an antenna into a rectangular pulse train and a sawtooth generator for converting the rectangular pulses into sawtooth pulses, the sawtooth generator including a transistor receiving the pulse train at its base, a capacitor connected between or in parallel with the emitter-collector path of the transistor and a constant current source to supply current to the capacitor.

Some of the advantages of the present invention over the prior art are that only a single apparatus is required to test many different electronic clocks having various oscillator frequencies thereby substantially decreasing equipment costs and permitting the testing of clocks to be accomplished quickly and without requiring the previous selection of a specific frequency and measuring apparatus corresponding thereto.

The present invention is generally characterized in the improvement, in a system for testing the accuracy of an oscillator of an electronic clock including an antenna for detecting the output of the clock oscillator and producing a frequency signal corresponding thereto and a comparing and indicating circuit for comparing a signal related to the frequency signal with a reference frequency and indicating the difference therebetween, of transforming means coupled with the antenna for transforming the frequency signal into a non-sinusoidal signal having the same frequency as the frequency signal, and a filter coupled between the transforming means and the comparing and indicating circuit for filtering the non-sinusoidal signal to pass a component of the non-sinusoidal signal having a frequency associated with the reference frequency to the comparing and indicating circuit whereby the system can be utilized to test clock oscillators operating at various frequencies of which the reference frequency is an integral multiple.

The present invention is further generally characterized in the improvement, in a method for testing the accuracy of an oscillator of an electronic clock including detecting the output of the clock oscillator, producing a frequency signal corresponding to the output of the clock oscillator, comparing a signal related to the frequency signal with a reference frequency and indicating the difference between the signal related to the frequency signal of the reference frequency, of transforming the frequency signal into a non-sinusoidal signal having the same frequency as the frequency signal and filtering the non-sinusoidal signal to pass a component thereof having a frequency associated with the reference frequency for comparison with the reference frequency whereby clock oscillators operating at various frequencies of which the reference frequency is an integral multiple can be tested.

Other objects and advantages of the present invention will become apparent from the following description of the preferred embodiment taken in conjunction with the accompanying drawing.

BRIEF DESCRIPTION OF THE DRAWING

The FIGURE is a schematic block diagram of a system for testing the accuracy of electronic clocks according to the present invention.

DESCRIPTION OF THE PREFERRED EMBODIMENT

A system for testing the accuracy of an electronic clock according to the present invention is shown in the FIGURE and includes an antenna, generally indicated at 1, containing an inductive receiver 2, a capacitive receiver 3 and an ultrasonic receiver 4, a signal processor 5 receiving the output from the antenna and a comparing and indicating circuit 6 comparing the frequency of the output of signal processor 5 and an internally generated reference frequency to supply a signal corresponding thereto to an indicating instrument 7. The comparing and indicating circuit 6 can include any suitable circuit for comparing a frequency signal with a reference frequency and providing an analog or digital signal corresponding to the difference between the frequencies. One example of circuitry for the comparing and indicating circuit 6 is described and shown in detail in co-pending U.S. Pat. application Ser. No. 747,731, now U.S. Pat. No. 4,078,419, of which the present inventor is a co-inventor, application Ser. No. 747,731, being incorporated herein by reference.

An electronic clock 8 to be tested includes an oscillator (not shown) having an output which is detected by one of the receivers in antenna 1 to produce a sinusoidal frequency signal A at the output of the antenna corresponding to the frequency of the clock oscillator, and the signal processor 5 has a pulse generator 9, such as a limiting amplifier, receiving the frequency signal A and converting the sinusoidal frequency signal A to a train of rectangular pulses B having the same frequency as the frequency signal A. The pulse train B is supplied to a sawtooth generator 10 which converts the rectangular pulses into a sawtooth pulse signal C having the same frequency as frequency signal A and pulse train B. The sawtooth generator 10 includes an NPN transistor 11 having a base receiving pulse train B, an emitter connected to ground and a collector. A capacitor 12 is connected between the emitter and collector, and a constant current source 13 is connected between the collector and a positive potential such that the capacitor 13 is substantially linearly charged when the transistor 11 is nonconductive in response to the negative portion of pulses supplied to the base and the capacitor is quickly discharged through the transistor 11 when it is conductive in response to the positive portion of pulses supplied to the base.

The sawtooth signal developed across the capacitor 12 is supplied to a quartz crystal filter 14 which has a narrow bandpass characteristic to only pass signals D of a frequency associated with the reference frequency with which the signal is to be compared in comparing and indicating circuit 6. Since, the amplitude of the sawtooth pulses will decrease as the frequency of the pulse train increases and will increase as the pulse train frequency decreases, the signal D from the filter 14 will have a substantially constant amplitude which facilitates processing of the signal in comparing and indicating circuit 6. The signal D from filter 14 is amplified by an amplifier 15 having a relatively small gain due to the constant amplitude of the signal D, the amplifier thus introducing minimal distortion and being of relatively simple design.

In operation, the limiting amplifier or pulse generator 9 and the sawtooth generator 10 form circuitry for transforming the sinusoidal frequency signal A into a nonsinusoidal signal C having the same frequency and, as is well known, being composed of harmonics which can be developed by Fourier analysis. The reference frequency is an integral multiple of the different clock frequencies utilized in most electronic clock oscillators, e.g. 16.384kHz, 32.768kHz, 262.175kHz and 4.194MHz; and, thus, when each clock frequency is transformed to the non-sinusoidal signal C, a harmonic component associated with the reference frequency will be produced and passed by the filter 14 to the comparing and indicating circuit 6. In this manner, a single testing apparatus can be used for clocks having various oscillator frequencies without requiring adjustments. The use of sawtooth pulses provides all integral multiples of each frequency signal A (i.e. fundamental frequency), as can easily be shown via Fourier analysis; and, consequently, the use of sawtooth pulses is preferred to rectangular pulses.

By forming the filter 14 as an active quartz filter, the filter has a particularly narrow passband to confine signals forwarded to the comparing and indicating circuit 6 to frequencies associated with the reference frequency. By "associated with" is meant that the filter 14 passes only signals near the frequency of the reference frequency, preferably within ± 300Hz, to thereby improve operation and accuracy of the comparing and indicating circuit.

The inductive, capacitive and ultrasonic receivers 2, 3 and 4 of the antenna 1 permit oscillations of electronic clocks to be detected without interference due to the mechanical structure of the clocks and permit testing of clocks having screens and special casings and the like.

Inasmuch as the present invention is subject to many variations, modifications and changes in detail, it is intended that all subject matter discussed above be interpreted as illustrative and not in a limiting sense.

What is claimed is:

1. In a system for testing the accuracy of an oscillator of an electronic clock including antenna means for detecting the output of the clock oscillator and producing a frequency signal corresponding thereto and comparing and indicating means for comparing a signal related to said frequency signal with a reference frequency and indicating the difference therebetween, the improvement comprising transforming means coupled with said antenna means for transforming said frequency signal into a non-sinusoidal signal having the same frequency as said frequency signal to produce harmonic components thereof; and filter means coupled between said transforming means and said comparing and indicating means for filtering said non-sinusoidal signal to pass a harmonic component of said non-sinusoidal signal having a frequency associated with said reference frequency to said comparing and indicating means whereby said system can be utilized to test clock oscillators operating at various frequencies of which said reference frequency is an integral multiple.

2. The improvement as recited in claim 1 wherein said transforming means includes means for transforming said frequency signal into a sawtooth signal.

3. The improvement as recited in claim 2 wherein said filter means includes an active quartz filter.

4. The improvement as recited in claim 3 wherein said antenna means includes an inductive receiver.

5. The improvement as recited in claim 3 wherein said antenna means includes a capacitive receiver.

6. The improvement as recited in claim 3 wherein said antenna means includes an ultrasonic receiver.

7. The improvement as recited in claim 1 wherein said transforming means includes means for transforming said frequency signal into a rectangular pulse train and means for transforming said rectangular pulse train into sawtooth pulses.

8. The improvement as recited in claim 7 wherein said means for transforming said rectangular pulse train into sawtooth pulses includes a transistor having a base receiving said pulse train, an emitter and a collector, a capacitor connected between said emitter and said collector and a constant current source connected to supply current to said capacitor.

9. The improvement as recited in claim 1 wherein said filter means passes a signal within ± 300Hz of said reference frequency.

10. In a method for testing the accuracy of an oscillator of an electronic clock including detecting the output of the clock oscillator, producing a frequency signal corresponding to the output of the clock oscillator, comparing a signal related to the frequency signal with a reference signal and indicating the difference between the signal related to the frequency signal of the reference frequency, the improvement comprising the steps of transforming the frequency signal into a non-sinusoidal signal having the same frequency as the frequency signal to produce harmonic components thereof; and filtering the non-sinusoidal signal to pass a harmonic component thereof having a frequency associated with the reference frequency for comparison with the reference frequency whereby clock oscillators operating at various frequencies of which the reference frequency is an integral multiple can be tested.

11. The improvement as recited in claim 10 wherein said transforming step includes transforming the frequency signal into sawtooth pulses.

* * * * *